United States Patent
Lai et al.

(10) Patent No.: US 10,665,509 B2
(45) Date of Patent: May 26, 2020

(54) METHOD FOR MANUFACTURING CHIP PACKAGES

(71) Applicant: Comchip Technology Co., Ltd., New Taipei (TW)

(72) Inventors: Chien-Chih Lai, New Taipei (TW); Hung-Wen Lin, New Taipei (TW)

(73) Assignee: COMCHIP TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/400,016

(22) Filed: Apr. 30, 2019

(65) Prior Publication Data

US 2020/0105601 A1  Apr. 2, 2020

(30) Foreign Application Priority Data

Sep. 28, 2018 (TW) .............. 107134514 A

(51) Int. Cl.
*H01L 21/82* (2006.01)
*H01L 21/683* (2006.01)
*H01L 21/768* (2006.01)
*H01L 23/00* (2006.01)

(52) U.S. Cl.
CPC .......... *H01L 21/82* (2013.01); *H01L 21/6838* (2013.01); *H01L 21/76816* (2013.01); *H01L 24/17* (2013.01)

(58) Field of Classification Search
CPC ................. H01L 21/82; H01L 21/6838; H01L 21/56816; H01L 24/24
See application file for complete search history.

(56) References Cited

U.S. PATENT DOCUMENTS

| | | | |
|---|---|---|---|
| 8,502,397 B2 * | 8/2013 | Yanagi | H01L 21/568 257/787 |
| 10,529,671 B2 * | 1/2020 | Lee | H01L 23/3135 |
| 2005/0148160 A1 * | 7/2005 | Farnworth | H01L 21/3043 438/462 |
| 2008/0081423 A1 * | 4/2008 | Sadwick | H01L 24/32 438/288 |
| 2011/0298123 A1 | 12/2011 | Hwang et al. | |
| 2013/0320519 A1 | 12/2013 | Kim | |
| 2016/0225733 A1 * | 8/2016 | Wilcoxen | H01L 24/14 |
| 2017/0179076 A1 | 6/2017 | Kamphuis et al. | |

* cited by examiner

*Primary Examiner* — William Coleman
(74) *Attorney, Agent, or Firm* — CKC & Partners Co., LLC

(57) ABSTRACT

A method for manufacturing chip package includes the steps below. A wafer having an upper surface and a lower surface opposite thereto is provided, in which conductive bumps are disposed on the upper surface. The upper surface of the wafer is diced to form trenches. A first insulation layer exposing the conductive bumps is formed on the upper surface and in the trenches. A surface treatment layer is formed on the conductive bumps, and a top surface of the surface treatment layer is higher than that of the first insulation layer. The wafer is thinned from the lower surface toward the upper surface to expose the first insulation layer in the trenches. A second insulation layer is formed below the lower surface. The first and second insulation layers are diced along a center of each trench to form chip packages.

9 Claims, 5 Drawing Sheets

METHOD FOR MANUFACTURING CHIP PACKAGES

CROSS-REFERENCE TO RELATED APPLICATION

This application claims priority to Taiwan Application Serial Number 107134514, filed Sep. 28, 2018, which is herein incorporated by reference.

BACKGROUND

Field of Invention

The present invention relates to a method for manufacturing chip packages.

Description of Related Art

In a conventional chip packaging process, semiconductor dies diced from a wafer is one by one packaged, which requires a lot of time and process steps. Alternatively, each of the semiconductor dies are arranged on a carrier board, followed by a packaging process and a dicing process to form a plurality of chip packages. This method of manufacturing chip package requires a long time of process and a high cost, and it is easy to cause a problem of alignment offset.

SUMMARY

The present invention provides a method of manufacturing chip packages for addressing the aforementioned issues.

According to one aspect of the present disclosure, a method for manufacturing chip packages includes the steps below. First, a wafer is provided. The wafer has an upper surface and a lower surface opposite thereto, and includes a plurality of conductive bumps disposed on the upper surface. The upper surface of the wafer is diced to form a plurality of trenches. A first insulation layer is formed on the upper surface and in the trenches, and the conductive bumps are exposed from the first insulation layer. A surface treatment layer is formed on the conductive bumps, and a top surface of the surface treatment layer is higher than a top surface of the first insulation layer. The wafer is thinned from its lower surface toward the upper surface to expose the first insulation layer in the trenches. A second insulation layer is formed on the lower surface. The first insulation layer and the second insulation layer are diced along a center of each trench to form a plurality of chip packages.

In one embodiment of the present disclosure, the surface treatment layer has a height ranged from about 2 um to about 10 um.

In one embodiment of the present disclosure, after the step of forming the first insulation layer and before the step of thinning the wafer, the method further includes forming an adhesive layer to cover the first insulation layer and the surface treatment layer and forming a carrier on the adhesive layer.

In one embodiment of the present disclosure, after the step of forming the second insulation layer and before the step of dicing the first insulation layer and the second insulation layer, the method further includes removing the carrier and the adhesive layer.

In one embodiment of the present disclosure, after the step of thinning the wafer, the wafer and the surface treatment layer have a first total thickness ranged from about 100 um to about 150 um.

In one embodiment of the present disclosure, after the step of forming the second insulation layer, the wafer, the surface treatment layer, and the second insulation layer have a second total thickness ranged from about 120 um to about 210 um.

In one embodiment of the present disclosure, a cutting width of dicing the first insulation layer and the second insulation layer along each trench is about 15 um to about 22 um.

In one embodiment of the present disclosure, each conductive bump has a height ranged from about 20 um to about 45 um.

In one embodiment of the present disclosure, each trench has a width ranged from about 50 um to about 70 um and a depth ranged from about 150 um to about 200 um.

In one embodiment of the present disclosure, after the step of providing the wafer, the wafer has a thickness ranged from about 525 um to about 725 um.

BRIEF DESCRIPTION OF THE DRAWINGS

The invention can be more fully understood by reading the following detailed description of the embodiment, with reference made to the accompanying drawings as follows.

DETAILED DESCRIPTION

The present disclosure is described by the following specific embodiments. Those with ordinary skill in the arts can readily understand the other advantages and functions of the present invention after reading the disclosure of this specification. The present disclosure can also be implemented with different embodiments. Various details described in this specification can be modified based on different viewpoints and applications without departing from the scope of the present disclosure.

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations.

Figure 1:
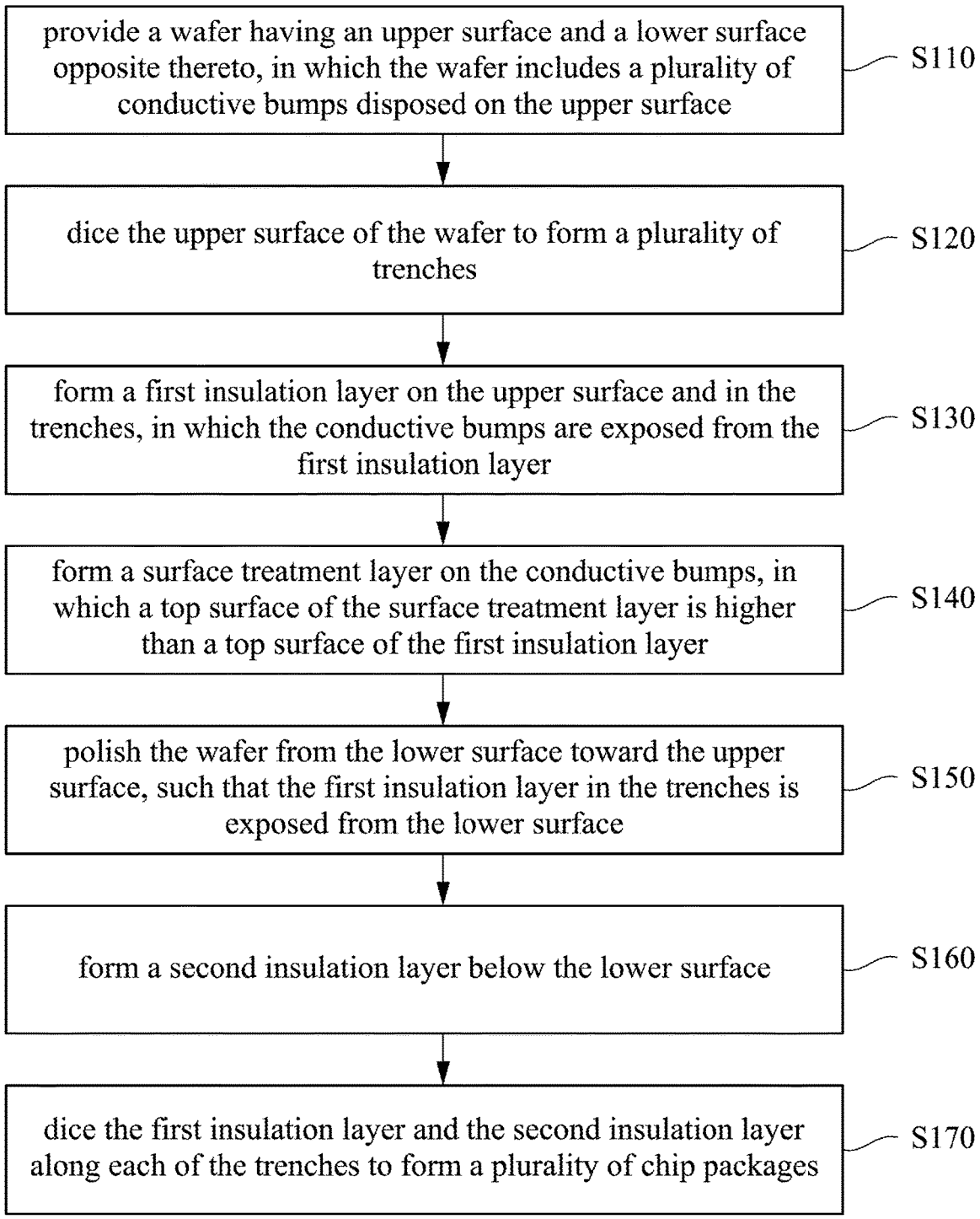
FIG. 1 illustrates a flow chart of a method of forming chip packages, in accordance with one embodiment of the present invention.

One aspect of the present invention is to provide a method for manufacturing chip packages. By this manufacturing method, the process hours and costs can be reduced, and the problem of alignment offset is not generated. FIG. 1 illustrates a flow chart of a method of forming the chip packages, in accordance with one embodiment of the present invention. FIG. 2A to FIG. 2F are cross-sectional views illustrating various process stages of forming the chip packages, in accordance with one embodiment of the present invention.

As shown in FIG. 1, the method 100 includes step S110, step S120, step S130, step S140, step S150, step S160, and step S170.

Figure 2A:
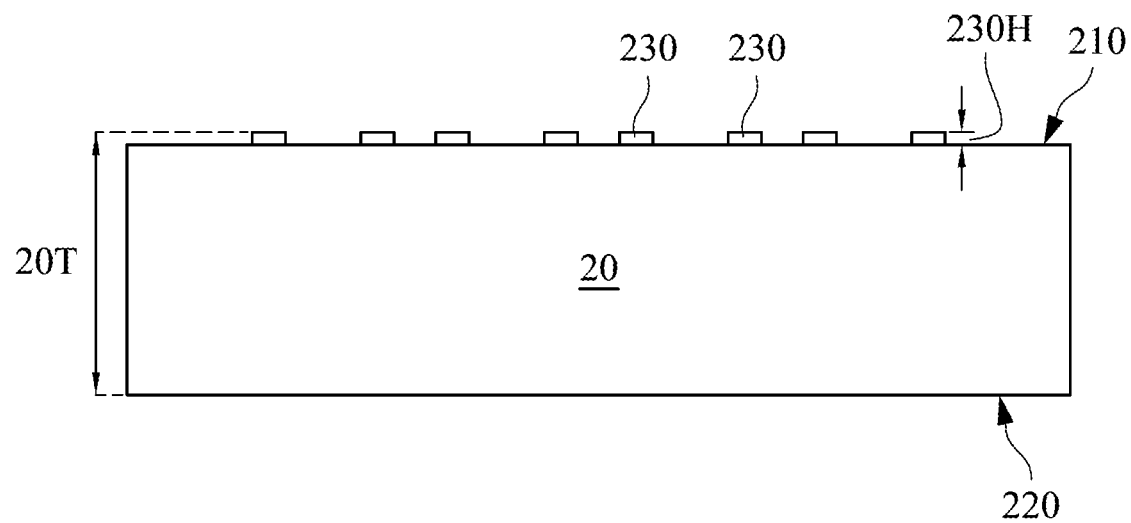
FIG. 2A to FIG. 2F are cross-sectional views illustrating various process stages of forming the chip packages, in accordance with one embodiment of the present invention.

In step S110, a wafer 20 is provided, as shown in FIG. 2A. To be specific, the wafer 20 has an upper surface 210 and a lower surface 220 opposite thereto. The wafer 20 includes a plurality of conductive bumps 230 disposed on the upper surface 210. In one embodiment, the wafer 20 may include silicon, germanium, or a Group III-V element, but not limited thereto. In various embodiments, the wafer 20 includes a plurality of conductive pads (not shown) disposed on the upper surface 210, and the conductive bumps 230 are disposed on the conductive pads. In some embodiments, a thickness 20T of the wafer 20 ranges from about 525 um to about 725 um. For example, the thickness 20T may be 550 um, 575 um, 600 um, 625 um, 650 um, 675 um, or 700 um.

In one embodiment, a height 230H of each conductive bump 230 ranges from about 20 um to about 45 um, such as 22 um, 24 um, 26 um, 28 um, 30 um, 32 um, 34 um, 36 um, 38 um, 40 um, or 42 um. In various embodiments, the method of forming the conductive bumps 230 includes, for example, the steps blow. First of all, a patterned mask (not shown) is formed on the upper surface 210 of the wafer 20. The patterned mask has a plurality of openings (not shown) exposing a portion of the upper surface 210 of the wafer 20. Thereafter, the conductive bumps 230 are formed in the opening by an electroplating process. In some embodiments, the conductive bumps 230 include gold, tin, copper, nickel, or other suitable metal materials.

Figure 2B:
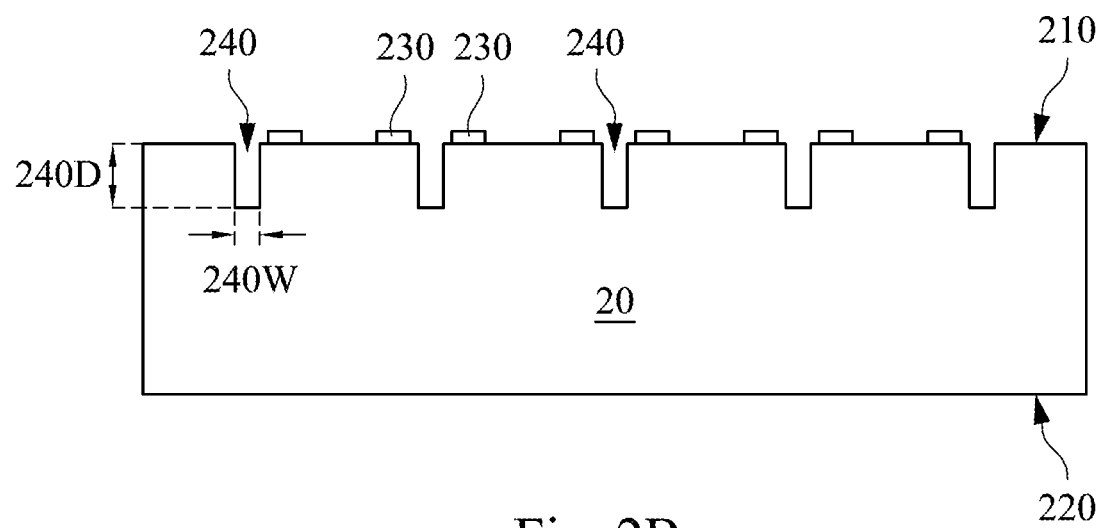

In step S120, the upper surface 210 of the wafer 20 is diced to form a plurality of trenches 240, as shown in FIG. 2B. In various embodiments, the step S120 may be implemented by using a cutting wheel process, a laser cutting process, or a waterjet cutting process. In one embodiment, each trench 240 has a width 240W ranged from about 50 um to 70 um and a depth 240D ranged from about 150 um to about 200 um. For example, the width 240W may be, but not limited to, 52 um, 54 um, 56 um, 58 um, 60 um, 62 um, 64 um, 66 um, or 68 um, and the depth 240D may be, but not limited to, 155 um, 160 um, 165 um, 170 um, 175 um, 180 um, 185 um, 190 um, or 195 um.

Figure 2C:
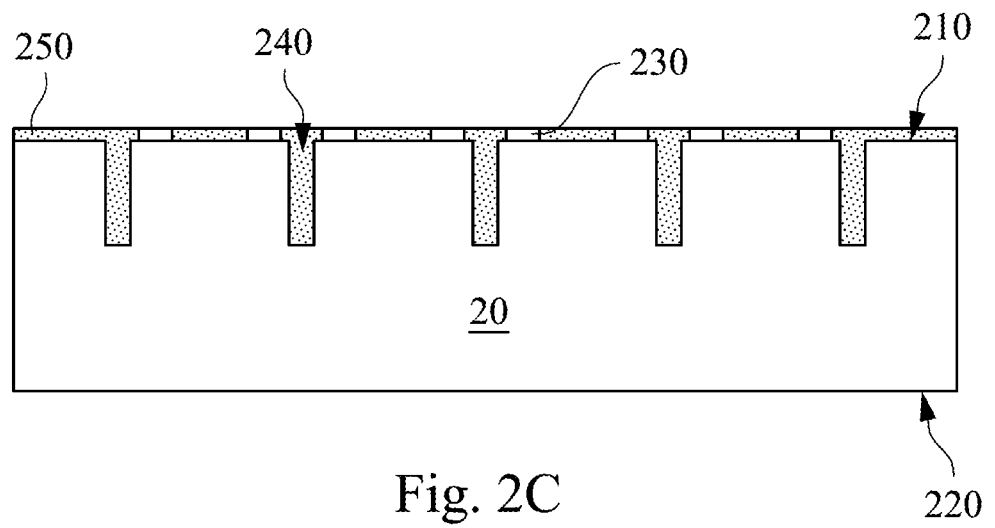

In step S130, a first insulation layer 250 is formed on the upper surface 210 and in the trenches, and the conductive bumps 230 are exposed from the first insulation layer 250, as shown in FIG. 2C. In some embodiments, the materials used for the first insulation layer 250 may be polyimide, epoxy, or other suitable insulating materials. In one embodiment, the first insulation layer 250 may be formed by an underfill dispensing process. Alternatively, the trenches 240 may be first filled by a printing process, a coating process, or a molding process, such that the upper surface 210 of the wafer 20 is completely covered. The conductive bumps 230 are then exposed by a planarization process, such as a chemical mechanical polishing (CMP) process, a mechanical abrasion process, a flat chemical etching process, a polishing process, an electrolytic etching process, or an electrolytic polishing etching process.

Figure 2D:
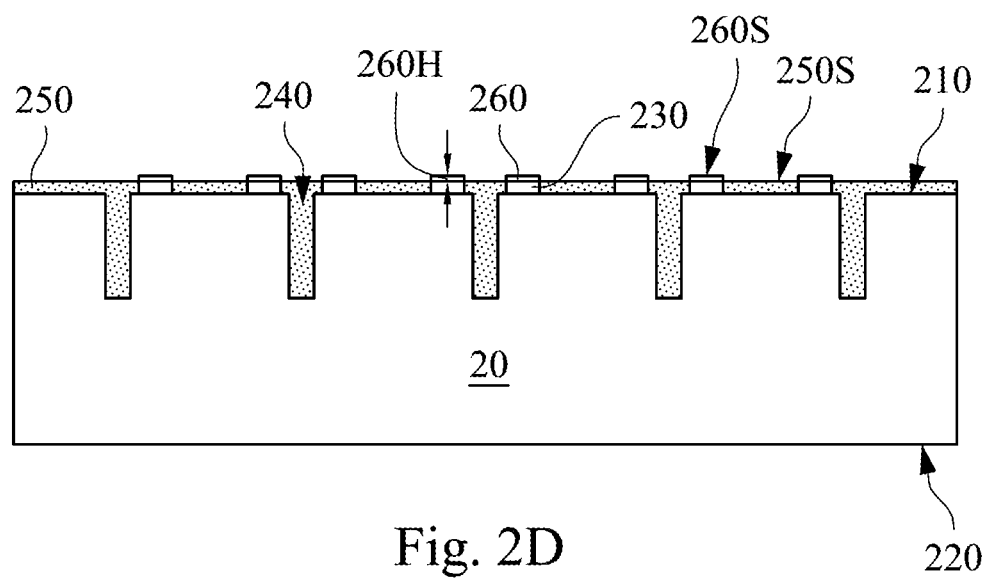

In step S140, a surface treatment layer 260 is formed on the conductive bumps 230, and a top surface 260S of the surface treatment layer 260 is higher than a top surface 250S of the first insulation layer 250, as shown in FIG. 2D. In some embodiments, the surface treatment layer 260 may be a single-layered structure or a multilayered structure consisting of sublayers of different materials. The single-layered structure may be, but not limited to, a nickel layer or a tin layer, and the multilayered-structure may be, but not limited to, a stacked metal layer having a nickel layer and a gold layer. In some examples, a height 260H of the surface treatment layer 260 ranges from about 2 um to about 10 um, such as 3 um, 4 um, 5 um, 6 um, 7 um, 8 um, or 9 um. The method of forming the surface treatment layer 260 includes, but not limited to, a physical process such as an electrolytic gold/nickel process and a hot air solder leveling (HASL) process, or a chemical process such as an electroless nickel immersion gold (ENIG) process.

Figure 2E:
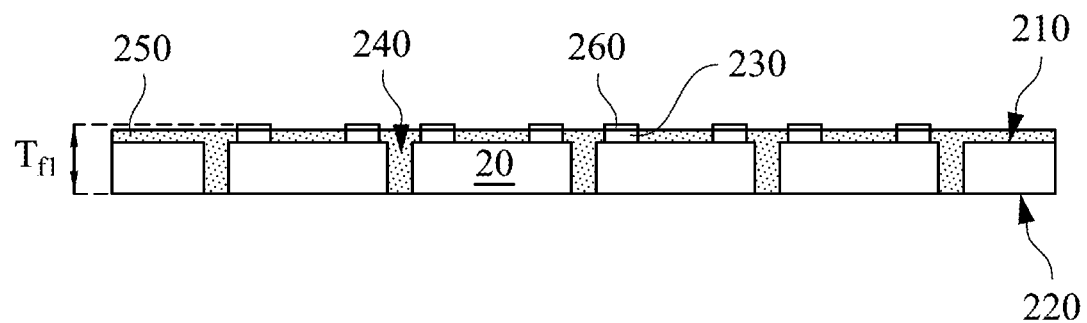

In step S150, the wafer 20 is thinned from the lower surface 220 toward the upper surface 210 to expose the first insulation layer 250 in the trenches 240 from the lower surface 220, as shown in FIG. 2E. The method of thinning the wafer 20 may be performed, for example, by a suitable process such as a chemical-mechanical polishing process or a dry etching process, so that the subsequently formed chip packages may have a smaller size. In some embodiments, after performing the step S150 by thinning the wafer 20, a first total thickness $T_{f1}$ of the wafer 20 and the surface treatment layer 260 ranges from about 100 um to about 150 um, such as 110 um, 115 um, 120 um, 125 um, 130 um, 135 um, 140 um, or 145 um. After completing the step S150, the wafer 20 is separated into a plurality of chips, and the relative position between the chips are maintained due to the presence of the first insulation layer 250 in the trenches 240. In this way, the problem of alignment offset in the prior art can be solved.

Figure 2F:
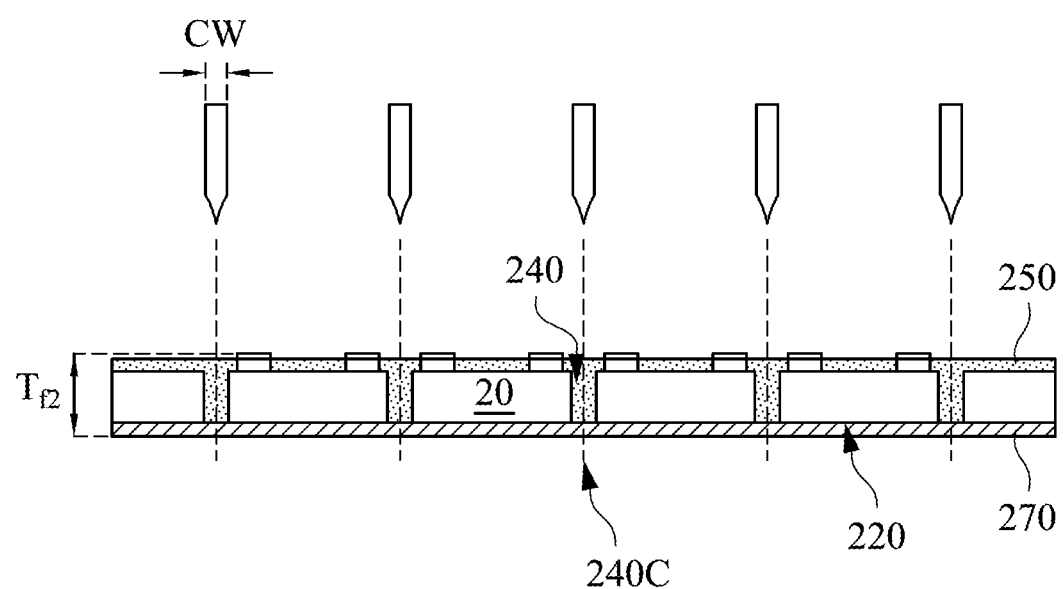

In step S160, a second insulation layer 270 is formed on or below the lower surface 220, as shown in FIG. 2F. In various embodiments, the materials of the second insulation layer 270 may be the same as or similar to the materials of the first insulation layer 250. In some embodiments, the method of forming the second insulation layer 270 may be the same as the method of forming the first insulation layer 250. In this embodiment, after performing the step S160 by forming the second insulation layer 270, the wafer 20, the surface treatment layer 260, and the second insulation layer 270 have a second total thickness $T_{f2}$ ranged from about 120 um to about 210 um, such as 125 um, 130 um, 135 um, 140 um, 145 um, 150 um, 155 um, 160 um, 165 um, 170 um, 175 um, 180 um, 185 um, 190 um, 195 um, 200 um, or 205 um.

In some embodiments, a laser mark (not shown) may be formed on the second insulation layer 270 of each chip after performing the step S160 by forming the second insulation layer 270 to indicate the product name of the subsequently formed chip packages.

In step S170, the first insulation layer 250 and the second insulation layer 270 are diced along each trench 240 to form a plurality of chip packages, as shown in FIG. 2F. In one embodiment, the first insulation layer 250 and the second insulation layer 270 are diced along a center 240C of each trench 240 to form a plurality of chip packages, for example. In various embodiments, the step S170 may be implemented by wheel cutting, laser cutting or waterjet cutting processes. In this embodiment, a cutting width CW formed or predetermined in the step of dicing the first insulation layer 250 and the second insulation layer 270 along each trench 240 is about 15 um to about 22 um, such as 15.5 um, 16.0 um, 16.5 um, 17.0 um, 17.5 um, 18.0 um, 18.5 um, 19.0 um, 19.5 um, 20.0 um, 20.5 um, 21.0 um, or 21.5 um.

In various examples, the chip package can be used to encapsulate a light sensing element or a light emitting element. However, its application is not limited thereto. For example, the chip package can be applied to variety of discrete components, active or passive elements, digital circuits, analog circuits, or other conventional integrated circuit electronic components. For example, opto electronic devices, micro electro mechanical systems (MEMS), micro fluidic systems, or physical sensors that measures physical quantities such as heat, light, and pressure. In particular, semiconductor chips such as image sensing components, light-emitting diodes (LEDs) or diode, solar cells, RF circuits, accelerators, gyroscopes, micro actuators, surface acoustic wave devices, process sensors, or ink printer heads can be packaged using a wafer scale package (WSP) process.

Figure 3A:
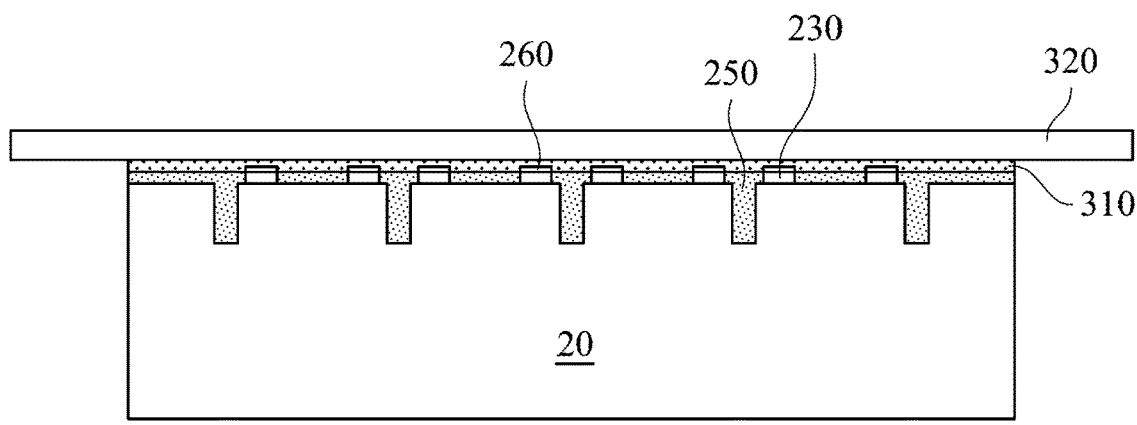
FIG. 3A to FIG. 3C are cross-sectional views illustrating various process stages of forming the chip packages, in accordance with another embodiment of the present invention.
Figure 3B:
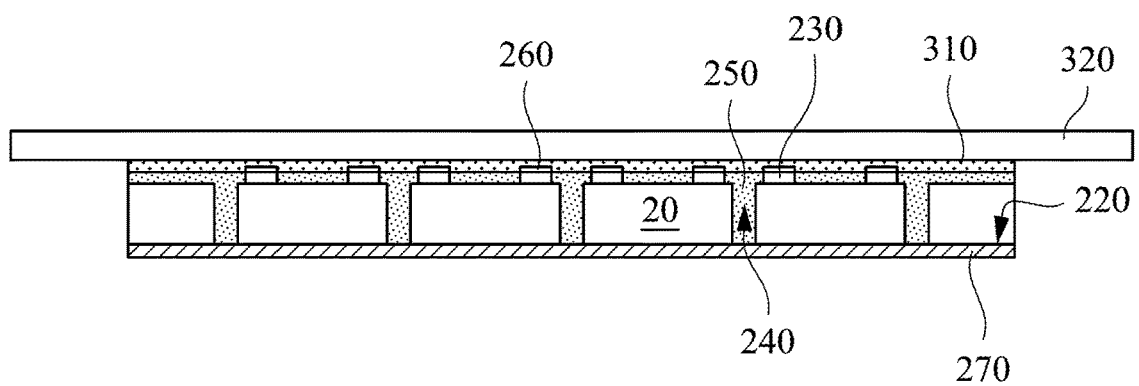
Figure 3C:
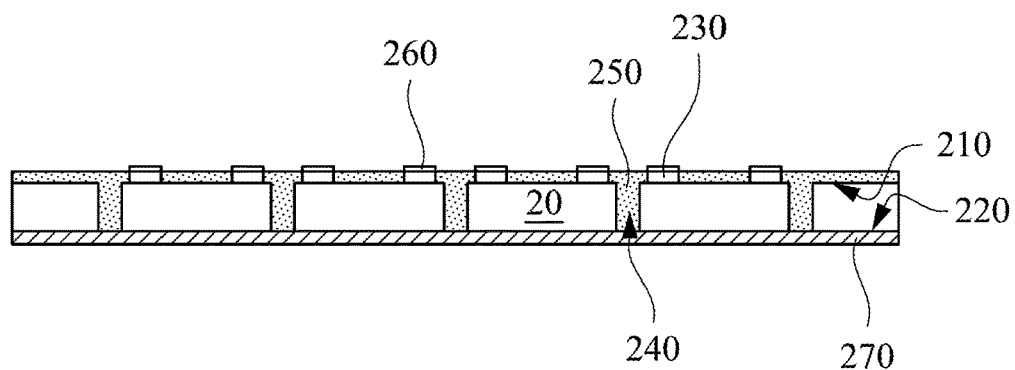

Hereinafter, a method of manufacturing chip packages according to another embodiment of the present invention will be briefly described. FIG. 3A to FIG. 3C are cross-sectional views illustrating various process stages of forming the chip packages, in accordance with another embodiment of the present invention. With reference to FIG. 3A, after the step S140 and before the step S150, an adhesive layer 310 is formed covering the first insulation layer 250, and a carrier 320 is then formed on the adhesive layer 310. The adhesive layer 310 can reduce the stress generated in subsequent thinning process; therefore the risk of wafer breakage is reduced. In one embodiment, the adhesive layer 310 includes UV release adhesives or thermal release adhesives. In one embodiment, the way of forming the adhesive layer 310 may be a spin coating process, but is not limited thereto. The carrier 320 provides excellent protection for the wafer 20. The carrier 320 may be a rigid insulating substrate, such as a glass substrate, a ceramic substrate, a sapphire substrate, or a quartz substrate, but is not limited thereto.

Next, after forming the structure as shown in FIG. 3A, the step S150 and the step S160 are performed to form the structure shown in FIG. 3B. The detailed description of the steps S150 and S160 will not be repeated hereinafter. After that, with reference to FIG. 3C, the carrier 320 and the adhesive layer 310 are removed after performing the step S160 by forming the second insulation layer 270. Specifically, the adhesive layer 310 may be irradiated by ultraviolet light or heated, so that the carrier 320 and the adhesive layer 310 can be detached together as the adhesion of the adhesive layer 310 decreases. After the structure as shown in FIG. 3C is completed, the step S170 is performed to form a plurality of chip packages.

In summary, the method of manufacturing the chip packages of the present invention not only reduces process hours and costs, but also avoids alignment offset problem.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for manufacturing chip packages, comprising steps of:
    providing a wafer having an upper surface and a lower surface opposite thereto, wherein the wafer comprises a plurality of conductive bumps disposed on the upper surface;
    dicing the upper surface of the wafer to form a plurality of trenches;
    forming a first insulation layer on the upper surface and in the trenches, wherein the conductive bumps are exposed from the first insulation layer;
    forming a surface treatment layer on the conductive bumps, wherein a top surface of the surface treatment layer is higher than a top surface of the first insulation layer;
    forming an adhesive layer to cover the first insulation layer and the surface treatment layer;
    forming a carrier on the adhesive layer;
    thinning the wafer from the lower surface toward the upper surface, such that the first insulation layer in the trenches is exposed from the lower surface;
    forming a second insulation layer on the lower surface; and
    dicing the first insulation layer and the second insulation layer along each of the trenches to form a plurality of chip packages.

2. The method of claim 1, wherein the surface treatment layer has a height ranged from 2 um to 10 um.

3. The method of claim 1, after the step of forming the second insulation layer and before the step of dicing the first insulation layer and the second insulation layer, further comprising:
    removing the carrier and the adhesive layer.

4. The method of claim 1, wherein after the step of thinning the wafer, the wafer and the surface treatment layer have a first total thickness ranged from 100 um to 150 um.

5. The method of claim 1, wherein after the step of forming the second insulation layer, the wafer, the surface treatment layer, and the second insulation layer have a second total thickness ranged from 120 um to 210 um.

6. The method of claim 1, wherein a cutting width of dicing the first insulation layer and the second insulation layer along each of the trenches is 15 um to 22 um.

7. The method of claim 1, wherein each of the conductive bumps has a height ranged from 20 um to 45 um.

8. The method of claim 1, wherein each of the trenches has a width ranged from 50 um to 70 um and a depth ranged from 150 um to 200 um.

9. The method of claim 1, wherein after the step of providing the wafer, the wafer has a thickness ranged from 525 um to 725 um.

* * * * *